United States Patent
Yen

(10) Patent No.: US 10,811,763 B2
(45) Date of Patent: Oct. 20, 2020

(54) SEMICONDUCTOR DEVICE PACKAGE AND METHOD OF MANUFACTURING THE SAME

(71) Applicant: Advanced Semiconductor Engineering, Inc., Kaohsiung (TW)

(72) Inventor: Han-Chee Yen, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/951,091

(22) Filed: Apr. 11, 2018

(65) Prior Publication Data
US 2019/0319337 A1    Oct. 17, 2019

(51) Int. Cl.
| | | |
|---|---|---|
| H01L 23/02 | (2006.01) | |
| H01Q 1/22 | (2006.01) | |
| H01L 23/31 | (2006.01) | |
| H01Q 1/38 | (2006.01) | |
| H05K 1/02 | (2006.01) | |
| H01L 23/14 | (2006.01) | |

(52) U.S. Cl.
CPC ........... *H01Q 1/2283* (2013.01); *H01L 23/14* (2013.01); *H01L 23/31* (2013.01); *H01Q 1/38* (2013.01); *H05K 1/0213* (2013.01)

(58) Field of Classification Search
CPC ............ H01L 23/66; H01L 2223/6677; H01L 2924/181; H01L 21/56; H01L 23/3135; H01L 23/28; H01L 23/3197; H01L 33/62
USPC .......................................... 257/678, 684, 787
See application file for complete search history.

(56) References Cited

U.S. PATENT DOCUMENTS

| | | | |
|---|---|---|---|
| 8,278,749 B2 * | 10/2012 | Lachner | H01L 23/3135 257/693 |
| 8,952,521 B2 * | 2/2015 | Wojnowski | H01L 23/49816 257/675 |
| 2010/0193935 A1 * | 8/2010 | Lachner | H01Q 1/2283 257/693 |

* cited by examiner

Primary Examiner — S. V. Clark
(74) Attorney, Agent, or Firm — Foley & Lardner LLP

(57) ABSTRACT

A semiconductor device package includes a circuit layer, an antenna structure, a first encapsulant and a reflector. The circuit layer has a first surface, a second surface opposite to the first surface and a third surface extended between the first surface and the second surface. The antenna structure is disposed within the circuit layer. The first encapsulant is disposed on the first surface of the circuit layer, the first encapsulant having a surface. The reflector is disposed on the first encapsulant. The third surface of the circuit layer is substantially coplanar with the surface of the first encapsulant.

19 Claims, 16 Drawing Sheets

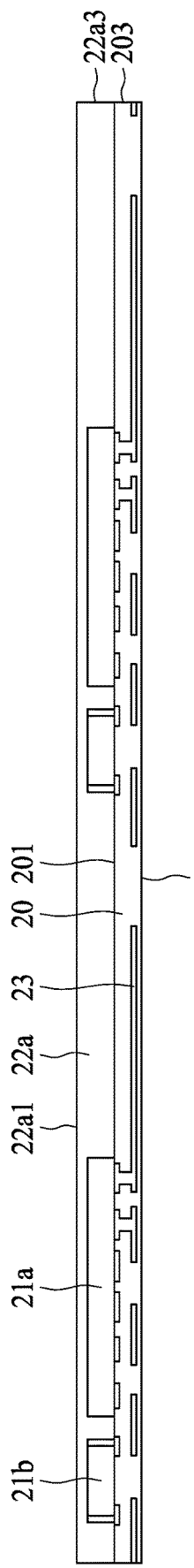
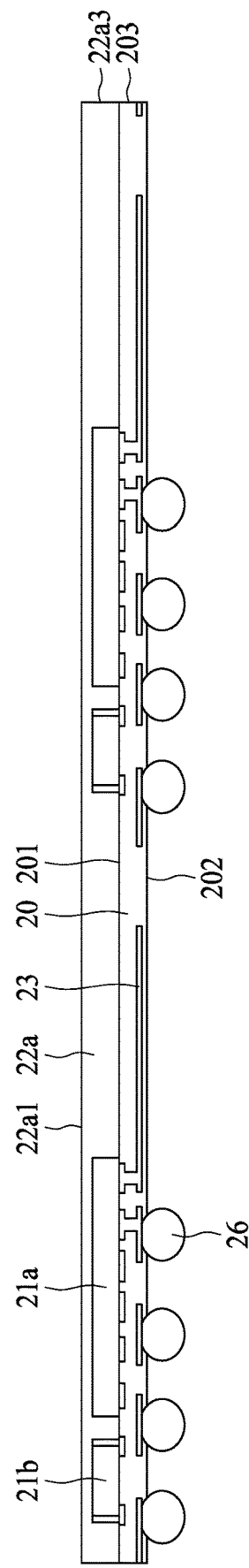

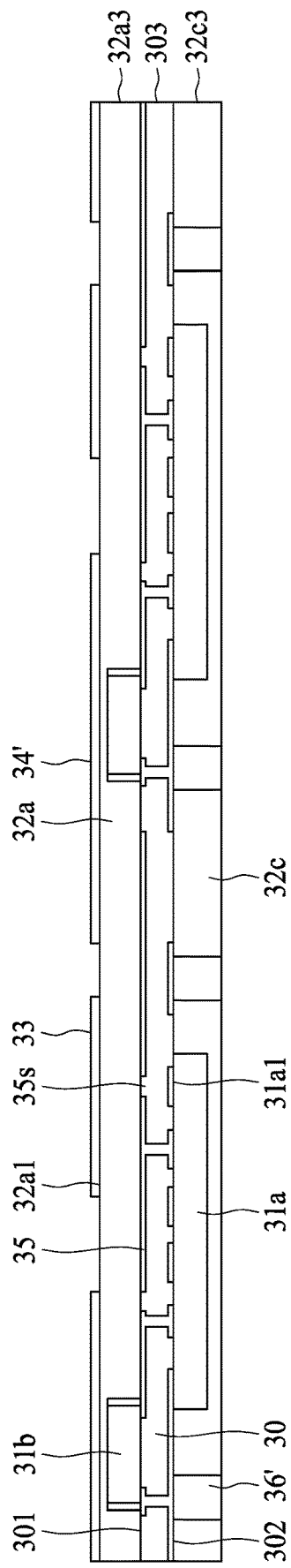
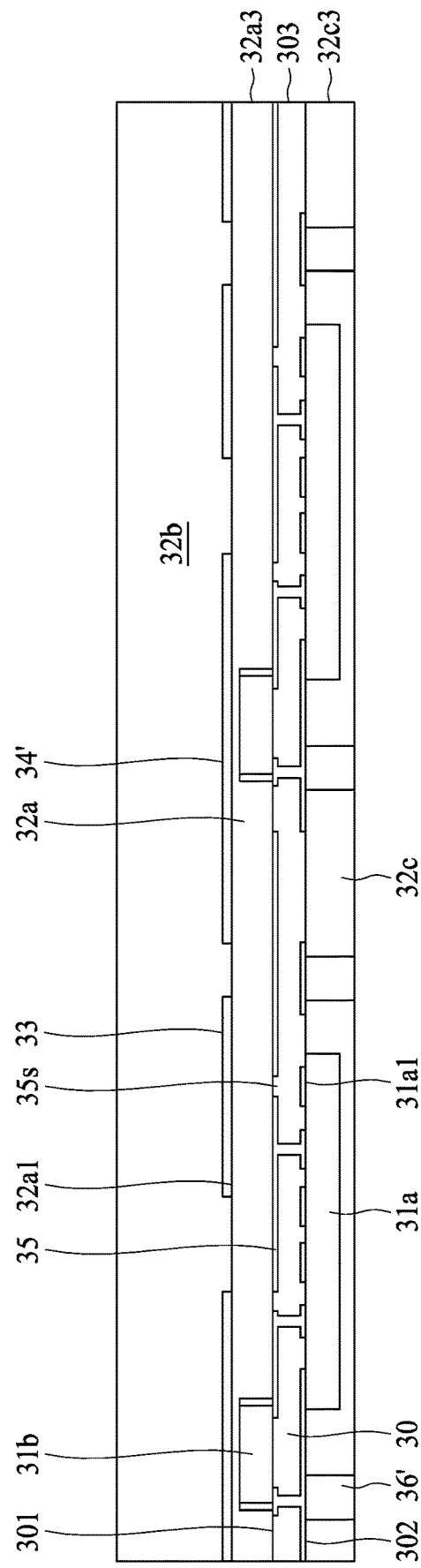
FIG. 7A
FIG. 7B

SEMICONDUCTOR DEVICE PACKAGE AND METHOD OF MANUFACTURING THE SAME

BACKGROUND

1. Technical Field

The present disclosure relates to a semiconductor device package and a method of manufacturing the same, and to a semiconductor device package including an antenna and a method of manufacturing the same.

2. Description of the Related Art

Wireless communication devices, such as cell phones, typically include antennas for transmitting and receiving radio frequency (RF) signals. In recent years, with the continuous development of mobile communication and the pressing demand for high data rate and stable communication quality, relatively high frequency wireless transmission (e.g., 28 GHz or 60 GHz) has become one of the most important topics in the mobile communication industry. However, signal attenuation is one of the problems at relatively high frequency (or relatively short wavelength) wireless transmission.

SUMMARY

In accordance with some embodiments of the present disclosure, a semiconductor device package includes a circuit layer, an antenna structure, a first encapsulant and a reflector. The circuit layer has a first surface, a second surface opposite to the first surface and a third surface extended between the first surface and the second surface. The antenna structure is disposed within the circuit layer. The first encapsulant is disposed on the first surface of the circuit layer, the first encapsulant having a surface. The reflector is disposed on the first encapsulant. The third surface of the circuit layer is substantially coplanar with the surface of the first encapsulant.

In accordance with some embodiments of the present disclosure, a semiconductor device package includes a circuit layer, a reflector, a first encapsulant and an antenna structure. The circuit layer has a first surface, a second surface opposite to the first surface and a third surface extended between the first surface and the second surface. The reflector is disposed within the circuit layer. The first encapsulant is disposed on the first surface of the circuit layer. The antenna structure is disposed on the first encapsulant.

In accordance with some embodiments of the present disclosure, a semiconductor device package includes a reflector, a first encapsulant and an antenna structure. The first encapsulant is disposed on the reflector. The antenna structure is disposed on the first encapsulant. A tolerance of a distance between the antenna structure and the reflector is in a range of about 2 micrometers (μm) to about 8 μm.

In accordance with some embodiments of the present disclosure, a method of manufacturing a semiconductor device package includes (a) providing a circuit layer including one of an antenna structure or a reflector; (b) forming a first encapsulant to cover the circuit layer; and (c) forming the other of the antenna structure or the reflector on the first encapsulant.

BRIEF DESCRIPTION OF THE DRAWINGS

FIG. 5A, FIG. 5B, FIG. 5C, FIG. 5D, FIG. 5E, FIG. 5F and FIG. 5G illustrate a semiconductor manufacturing method in accordance with some embodiments of the present disclosure.

FIG. 7A, FIG. 7B and FIG. 7C illustrate a semiconductor manufacturing method in accordance with some embodiments of the present disclosure.

Figure 1:
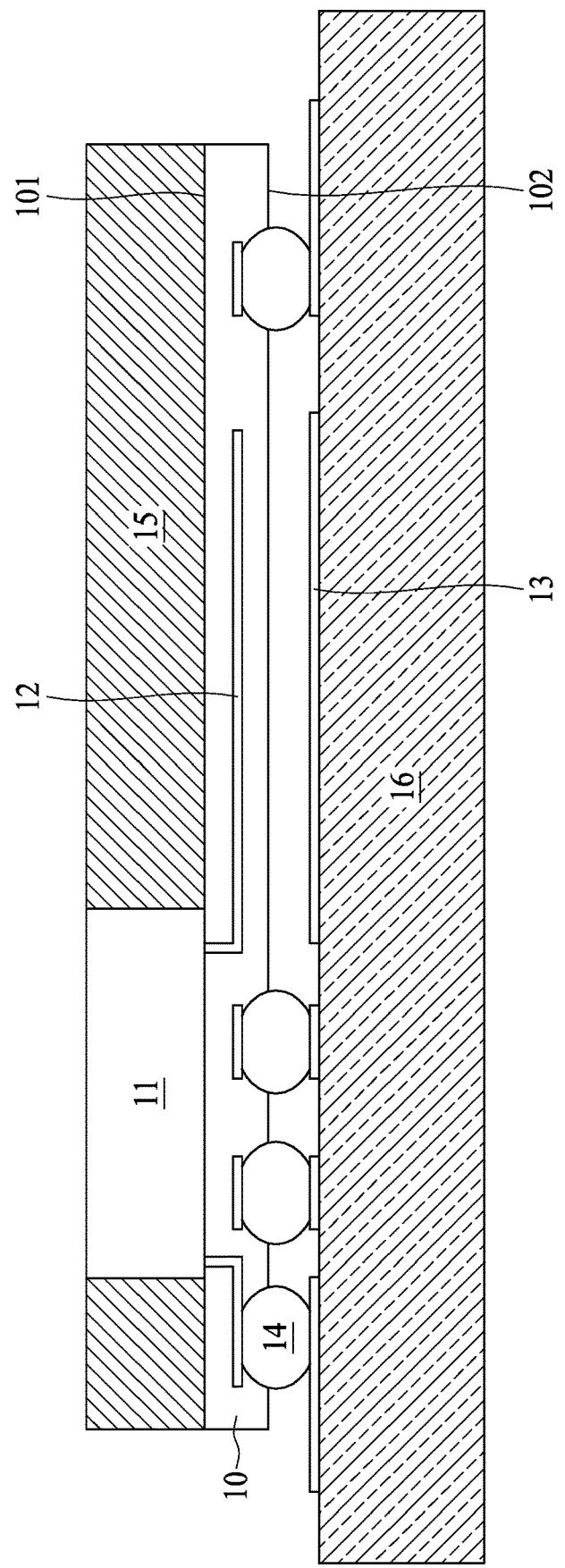
FIG. 1 illustrates a cross-sectional view of a semiconductor device package in accordance with some embodiments of the present disclosure.

Common reference numerals are used throughout the drawings and the detailed description to indicate the same or similar components. The present disclosure will be readily understood from the following detailed description taken in conjunction with the accompanying drawings.

DETAILED DESCRIPTION

FIG. 1 illustrates a cross-sectional view of a semiconductor device package 1 in accordance with some embodiments of the present disclosure. The semiconductor device package 1 includes a substrate 10, an electronic component 11, an antenna (or antenna structure) 12, a reflector 13, an electrical contact 14, a package body (or encapsulant) 15 and a printed circuit board (PCB) 16.

The substrate 10 may be, for example, a printed circuit board, such as a paper-based copper foil laminate, a composite copper foil laminate, or a polymer-impregnated glass-fiber-based copper foil laminate. The substrate 10 may include an interconnection structure (or electrical connection), such as a redistribution layer (RDL) or a grounding element. The substrate 10 has a surface 101 and a surface 102 opposite to the surface 101. The electrical contact 14 is disposed adjacent to the surface 102 of the substrate 10 to provide electrical connections with the electronic component 11 to an external circuit.

The electronic component 11 is disposed on the surface 101 of the substrate 10. The electronic component 11 may be an active electronic component, such as an integrated circuit (IC) chip or a die. The electronic component 11 may be electrically connected to the substrate 10 (e.g., to the RDL) by way of flip-chip or wire-bond techniques.

The antenna 12 is disposed within the substrate 10 and electrically connected to the electronic component 11. In some embodiments, the antenna 12 extends within the substrate 10. The antenna 12 is, or includes, a conductive material such as a metal or metal alloy. Examples of the conductive material include gold (Au), silver (Ag), aluminum (Al), copper (Cu), or an alloy thereof.

The package body 15 is disposed on the surface 101 of the substrate 10 to encapsulate or surround the electronic component 11. In some embodiments, the package body 15 includes an epoxy resin including fillers, a molding compound (e.g., an epoxy molding compound or other molding compound), a polyimide, a phenolic compound or material, a material including a silicone dispersed therein, or a combination thereof.

The reflector 13 is disposed on the PCB 16 at a position corresponding to the antenna 12. For example, the reflector 13 is disposed under the antenna 12 and faces toward the antenna 12. In some embodiments, the reflector 13 and the antenna 12 are formed of a same material. Alternatively, the reflector 13 and the antenna 12 are formed of different materials. Without the reflector 13, the radiation of energy from the antenna 12 is transmitted in many directions, which can cause signal attenuation, especially when the signal of the antenna 12 is transmitted at relatively high frequency (or relatively short wavelength). With the reflector 13, the radiation emitted from the antenna 12 toward the reflector 13 can be reflected by the reflector 13, so the radiation from the antenna 12 can be substantially directed in one or more directions (e.g., a direction substantially perpendicular to the substrate 10), which would increase the gain and the radiation efficiency of the antenna 12. However, due to a tolerance of the electrical contact 14 for a manufacturing process and a distortion of the electrical contact 14 after a reflow process, there may be about 20% deviation of a distance between the antenna 12 and the reflector 13, which can cause the misalignment between the antenna 12 and reflector 13, so as to adversely affect the radiation efficiency of the antenna 12.

Figure 2:
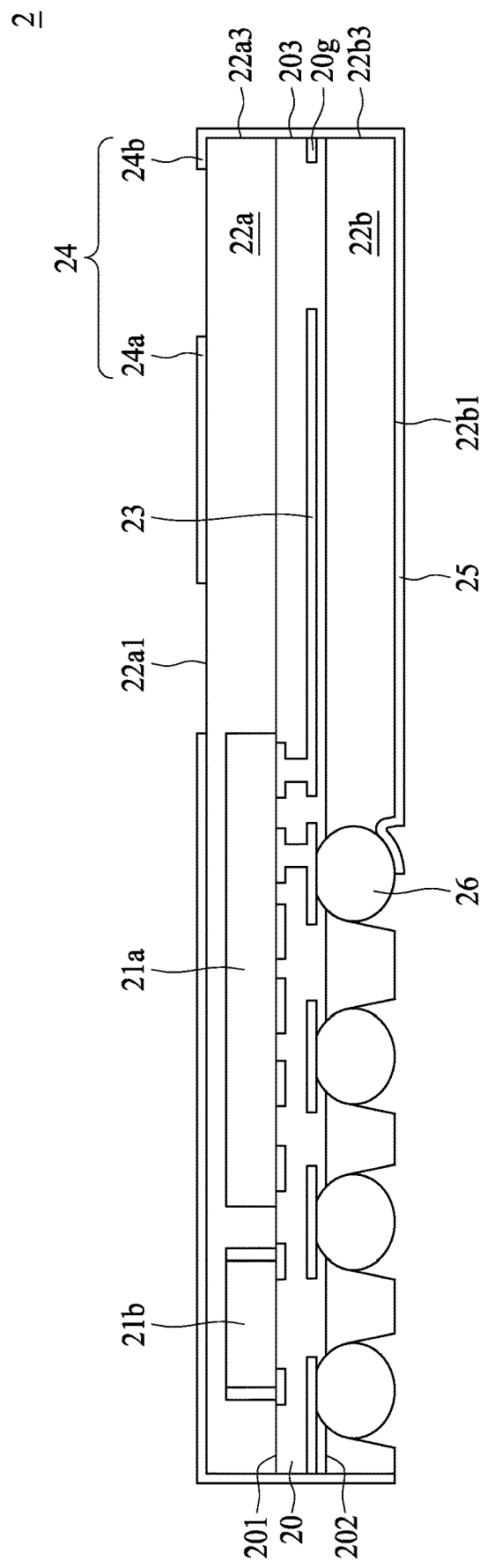
FIG. 2 illustrates a cross-sectional view of a semiconductor device package in accordance with some embodiments of the present disclosure.

FIG. 2 illustrates a cross-sectional view of a semiconductor device package 2 in accordance with some embodiments of the present disclosure. The semiconductor device package 2 includes a substrate 20, electronic components 21a, 21b, package bodies 22a, 22b, an antenna 23, a conductive layer 24, a reflector 25 and an electrical contact 26.

The substrate 20 may be, for example, a printed circuit board, such as a paper-based copper foil laminate, a composite copper foil laminate, or a polymer-impregnated glass-fiber-based copper foil laminate. The substrate 20 may include an interconnection structure (or electrical connection), such as an RDL or a grounding element. For example, the substrate 20 includes a circuit layer including at least one RDL covered or encapsulated by a dielectric layer. The substrate 20 has a surface 201, a surface 202 opposite to the surface 201 and a surface 203 (e.g. a lateral surface) extending between the surfaces 201 and 202. The electrical contact 26 is disposed adjacent to the surface 202 of the substrate 20 to provide electrical connections with the electronic components 21a, 21b to an external circuit.

The electronic components 21a, 21b are disposed on the surface 201 of the substrate 20. The electronic component 21a may be an active electronic component, such as an IC or a die. The electronic component 21b may be a passive electronic component, such as a capacitor, a resistor or an inductor. Each electronic component 21a, 21b may be electrically connected to one or more other electronic components and to the substrate 20 (e.g., to the RDL), and electrical connection may be attained by way of flip-chip or wire-bond techniques.

The package body 22a is disposed on the surface 201 of the substrate 20 to cover or encapsulate the electronic components 21a, 21b. The package body 22b is disposed on the surface 202 of the substrate 20 to cover or encapsulate a portion of the electrical contact 26. In some embodiments, a lateral surface 22a3 of the package body 22a and a lateral surface 22b3 of the package body 22b are substantially coplanar with the surface 203 of the substrate 20. In some embodiments, the package bodies 22a, 22b include an epoxy resin including fillers, a molding compound (e.g., an epoxy molding compound or other molding compound), a polyimide, a phenolic compound or material, a material including a silicone dispersed therein, or a combination thereof.

The antenna 23 is disposed within the substrate 20 and electrically connected to the electronic component 21a. In some embodiments, the antenna 23 extends within the substrate 20. The antenna 23 is, or includes, a conductive material such as a metal or metal alloy. Examples of the conductive material include Au, Ag, Al, Cu, or an alloy thereof.

The reflector 25 is disposed on a surface 22b1 of the package body 22b, at a position corresponding to the antenna 23 (e.g. below the antenna 23). For example, the reflector 25 faces toward the antenna 23. The reflector 25 may extend over a distance at least as long as a length of the antenna 23. In some embodiments, the reflector 25 and the antenna 23 are formed of a same material. Alternatively, the reflector 25 and the antenna 23 are formed of different materials. In some embodiments, the reflector 25 extends along the surface 22b1 of the package body 22b and is in contact with a portion of the electrical contact 26 that is exposed from the package body 22b. In some embodiments, the reflector 25 is grounded. In some embodiments, the reflector 25 is a conductive layer. The reflector 25 is configured to reflect the radiation emitted from the antenna 23, so the radiation from the antenna 23 can be substantially directed in one or more directions (e.g., a direction substantially perpendicular to the substrate 20), which would increase the gain and the radiation efficiency of the antenna 23.

The conductive layer 24 includes a first portion 24a and a second portion 24b. The second portion 24b of the conductive layer 24 surrounds the first portion 24a of the conductive layer 24 and is separated from the first portion 24a of the conductive layer 24. In some embodiments, the first portion 24a of the conductive layer 24 is electrically insulated from the second portion 24b of the conductive layer 24. The first portion 24a of the conductive layer 24 is disposed on the surface 22a1 of the package body 22a at a position corresponding to the antenna 23 (e.g. above the antenna 23). For example, the first portion 24a of the conductive layer 24 faces toward the antenna 23. In some embodiments, the first portion 24a of the conductive layer 24 acts as a radiation director to increase the radiation efficiency of the antenna 23. The second portion 24b of the conductive layer 24 is disposed on the surface 22a1 of the package body 22a. In some embodiments, the second portion 24b of the conductive layer 24 extends along the lateral surface 22a3 of the package body 22a, the surface 203 of the substrate 20 and the lateral surface 22b3 of the package body 22b. In some embodiments, the second portion 24b of the conductive layer 24 is in contact with the reflector 25. In some embodiments, the second portion 24b of the conductive layer 24 can be electrically connected to a grounding element 20g of the substrate 20. A portion of the grounding element 20g may be exposed from the surface 203 of the substrate 20 and may be in contact with the second portion 24b of the conductive layer 24.

In some embodiments, the conductive layer 24 is a conductive thin film, and may include, for example, Al, Cu, chromium (Cr), tin (Sn), Au, Ag, nickel (Ni) or stainless steel, or a mixture, an alloy, or other combination thereof. The conductive layer 24 may include a single conductive layer or multiple conductive layers. In some embodiments, the conductive layer 24 includes multiple (or a plurality of) conductive layers, and the multiple conductive layers may include a same material, or ones of the multiple conductive layers may include different materials, or each of the multiple conductive layers may include different materials from others of the multiple conductive layers.

In accordance with the embodiments in FIG. 2, the antenna 23 and the reflector 25 are integrated into a single package (e.g., the semiconductor device package 2). Because a tolerance (e.g., in a range of about 4% to about 6%) of the package body 22b is less than a tolerance (e.g., about 20%) of the electrical contact 14 (which may be, for example, a solder bump) in FIG. 1, compared to the semiconductor device package 1 in FIG. 1, which uses the electrical contact 14 to space the antenna 12 from the reflector 13, the semiconductor device package 2 using the package body 22b to space the antenna 23 from the reflector 25 can reduce misalignment between the reflector 25 and the antenna 23. For example, a tolerance of a distance between the antenna 23 and the reflector 25 is in a range of about 2 μm to about 8 μm. Therefore, compared to the semiconductor device package 1 in FIG. 1, the semiconductor device package 2 has a better radiation efficiency. In addition, by integrating the antenna 23 and the reflector 25 into a single package, the PCB 16 as shown in FIG. 1 may be omitted, which can reduce the total size of the semiconductor device package 2.

Figure 3A:
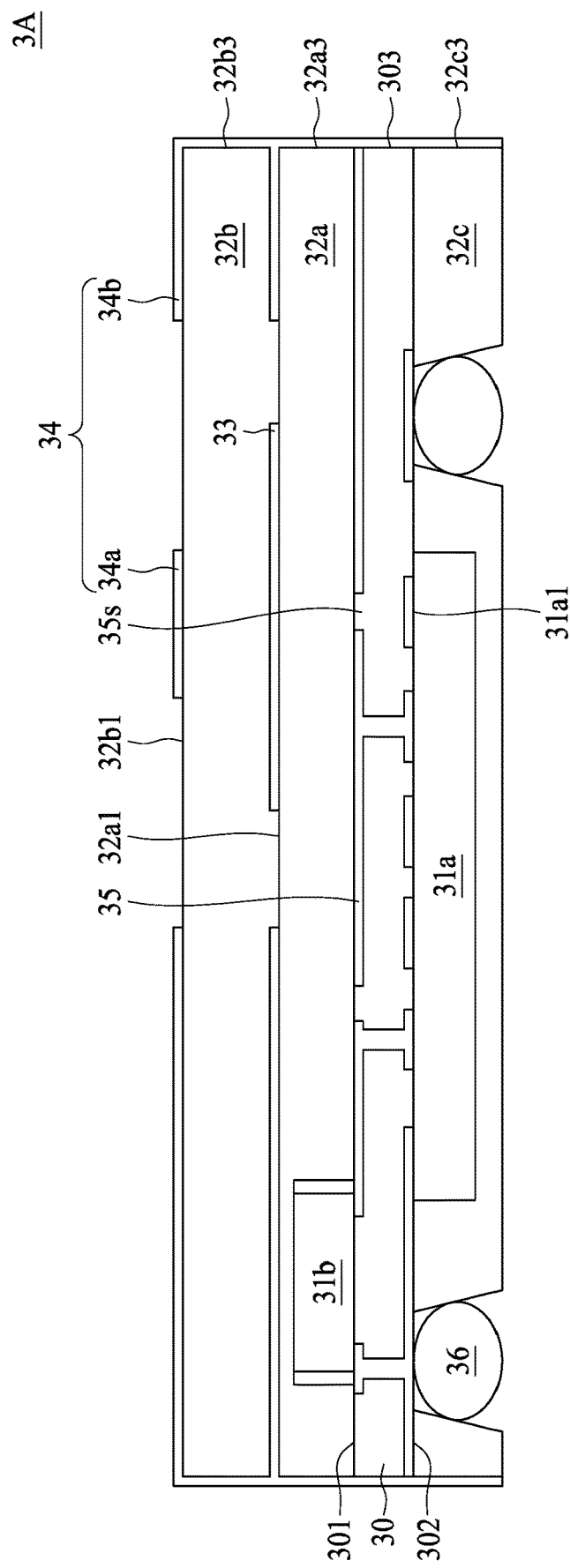
FIG. 3A illustrates a cross-sectional view of a semiconductor device package in accordance with some embodiments of the present disclosure.

FIG. 3A illustrates a cross-sectional view of a semiconductor device package 3A in accordance with some embodiments of the present disclosure. The semiconductor device package 3A includes a substrate 30, electronic components 31a, 31b, package bodies 32a, 32b, 32c, an antenna 33, a conductive layer 34, a reflector 35 and an electrical contact 36.

The substrate 30 may be, for example, a printed circuit board, such as a paper-based copper foil laminate, a composite copper foil laminate, or a polymer-impregnated glass-fiber-based copper foil laminate. The substrate 30 may include an interconnection structure (or electrical connection), such as an RDL or a grounding element. For example, the substrate 30 includes a circuit layer including at least one RDL covered or encapsulated by a dielectric layer. The substrate 30 has a surface 301, a surface 302 opposite to the surface 301 and a surface 303 (e.g. a lateral surface) extending between the surfaces 301 and 302. The electrical contact 36 is disposed on the surface 302 of the substrate 30 to provide electrical connections with the electronic components 31a, 31b to an external circuit.

The electronic component 31a is disposed on the surface 302 of the substrate 30 and the electronic component 31b is disposed on the surface 301 of the substrate 30. The electronic component 31a may be an active electronic component, such as an IC or a die. The electronic component 31b may be a passive electronic component, such as a capacitor, a resistor or an inductor. Each of the electronic components 31a, 31b may be electrically connected to one or more other electronic components and to the substrate 30 (e.g., to the RDL), and electrical connection may be attained by way of flip-chip or wire-bond techniques.

The reflector 35 is disposed within the substrate 30 and may be electrically connected to the electronic component 31a (e.g., to a ground pad of the electronic component 31a). In some embodiments, the reflector 35 extends within the substrate 30. The reflector 35 is, or includes, a conductive material such as a metal or metal alloy. Examples of the conductive material include Au, Ag, Al, Cu, or an alloy thereof. The reflector 35 is configured to reflect the radiation emitted from the antenna 33, so the radiation from the antenna 33 can be substantially directed in one or more directions (e.g., a direction substantially perpendicular to the substrate 30), which would increase the gain and the radiation efficiency of the antenna 33.

In some embodiments, the reflector 35 defines a slot 35s (or aperture) at a position corresponding to (e.g. above) a feeding line 31a1 disposed adjacent to the surface 302 of the substrate 30. In some embodiments, the feeding line 31a1 is electrically connected to a terminal of the electronic component 31a that is configured to transmit and/or receive high frequency signals. In some embodiments, the slot 35s of the reflector 35 also corresponds to (e.g. is disposed under) the antenna 33, and hence the feeding line 31a1 can be electromagnetically coupled to the antenna 33 to receive signals from the antenna 33 and/or to transmit signals to the antenna 33 through the slot 35s. Therefore, the feeding line 31a1 can communicate to the antenna 33 through electromagnetic wave without using a transmission line.

The package body 32a is disposed on the surface 301 of the substrate 30 to cover or encapsulate the electronic component 31b. The package body 32c is disposed on the surface 302 of the substrate 30 to cover or encapsulate a portion of the electrical contact 36. In some embodiments, a lateral surface 32a3 of the package body 32a and a lateral surface 32c3 of the package body 32c are substantially coplanar with the surface 303 of the substrate 30. In some embodiments, the package bodies 32a, 32c include an epoxy resin including fillers, a molding compound (e.g., an epoxy molding compound or other molding compound), a polyimide, a phenolic compound or material, a material including a silicone dispersed therein, or a combination thereof.

The antenna 33 is disposed on a surface 32a1 of the package body 32a at a position corresponding to (e.g. above) the reflector 35. In some embodiments, the antenna 35 extends along the surface 32a1 of the package body 32a. The antenna 33 is, or includes, a conductive material such as a metal or metal alloy. Examples of the conductive material include Au, Ag, Al, Cu, or an alloy thereof. In some embodiments, the reflector 35 and the antenna 33 are formed of a same material. Alternatively, the reflector 35 and the antenna 33 are formed of different materials.

The package body 32b is disposed on the surface 32a1 of the package body 32a to cover or encapsulate the antenna 33. In some embodiments, a lateral surface 32b3 of the package body 32b and the lateral surface 32a3 of the package body 32a are substantially coplanar. In some embodiments, the package body 32b includes an epoxy resin including fillers, a molding compound (e.g., an epoxy molding compound or other molding compound), a polyimide, a phenolic compound or material, a material including a silicone dispersed therein, or a combination thereof.

The conductive layer 34 includes a first portion 34a and a second portion 34b. The second portion 34b of the conductive layer 34 surrounds the first portion 34a of the conductive layer 34 and is separated from the first portion 34a of the conductive layer 34. The first portion 34a of the conductive layer 34 is disposed on a surface 32b1 of the package body 32b at a position corresponding to (e.g. above) the antenna 33. For example, the first portion 34a of the conductive layer 34 faces toward the antenna 33. In some embodiments, the first portion 34a of the conductive layer 34 acts as a radiation director to increase the radiation efficiency of the antenna 33. The second portion 34b of the conductive layer 34 is disposed on the surface 32b1 of the package body 32b. In some embodiments, the second portion 34b of the conductive layer 34 extends along the lateral surface 32b3 of the package body 32b, the lateral surface 32a3 of the package body 32a, the surface 303 of the substrate 30 and the lateral surface 32c3 of the package body 32c. In some embodiments, the second portion 34b of the conductive layer 34 extends along the surface 32a1 of the package body 32a, and is separated from the antenna 33. In some embodiments, the second portion 34b of the conductive layer 34 is in contact with a portion of the reflector 35 that is exposed from the lateral surface 303 of the substrate 30. In some embodiments, the second portion 34b of the conductive layer 34 can be electrically connected to a grounding element of the substrate 30.

In some embodiments, the conductive layer 34 is a conductive thin film, and may include, for example, Al, Cu, Cr, Sn, Au, Ag, Ni or stainless steel, or a mixture, an alloy, or other combination thereof. The conductive layer 34 may include a single conductive layer or multiple conductive layers. In some embodiments, the conductive layer 34 includes multiple (or a plurality of) conductive layers, and the multiple conductive layers may include a same material, or ones of the multiple conductive layers may include different materials, or each of the multiple conductive layers may include different materials from others of the multiple conductive layers.

Figure 3B:
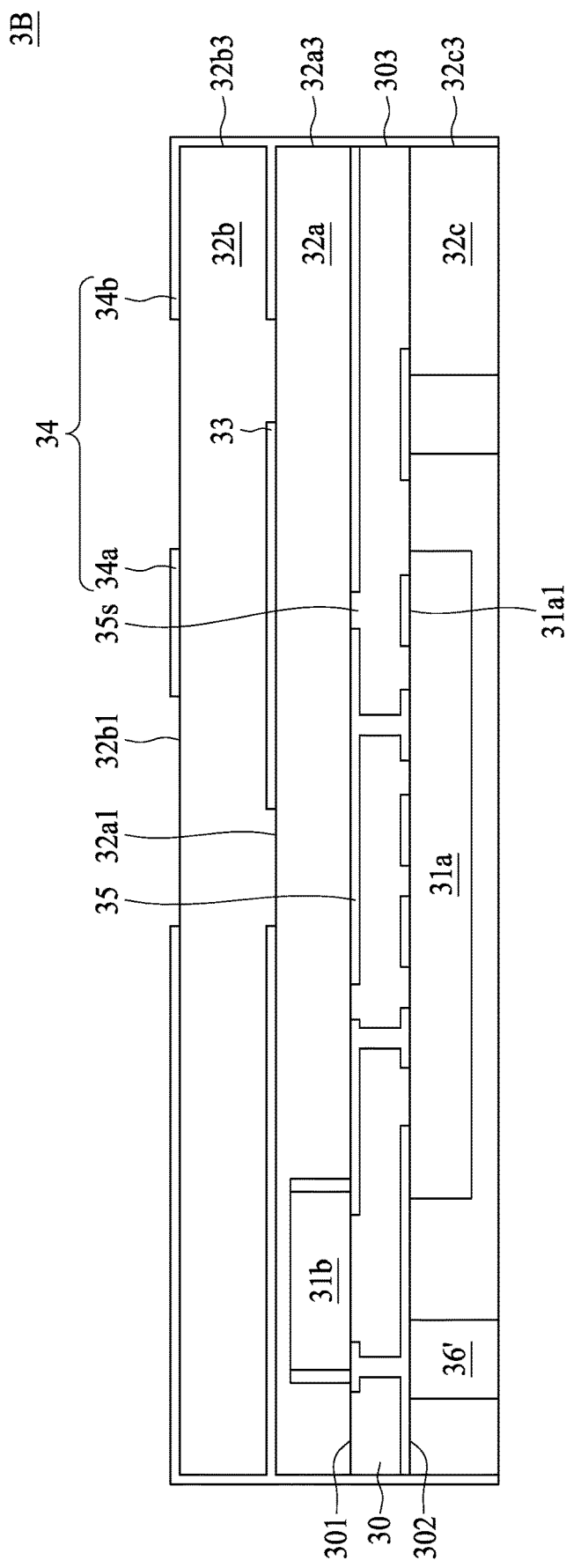
FIG. 3B illustrates a cross-sectional view of a semiconductor device package in accordance with some embodiments of the present disclosure.

FIG. 3B illustrates a cross-sectional view of a semiconductor device package 3B in accordance with some embodiments of the present disclosure. The semiconductor device package 3B is similar to the semiconductor device package 3A in FIG. 3A except that in FIG. 3B, the electrical contact 36 (which may be a solder bump) of the semiconductor device package 3A is replaced by a conductive post 36', such as a copper pillar.

Figure 4A:
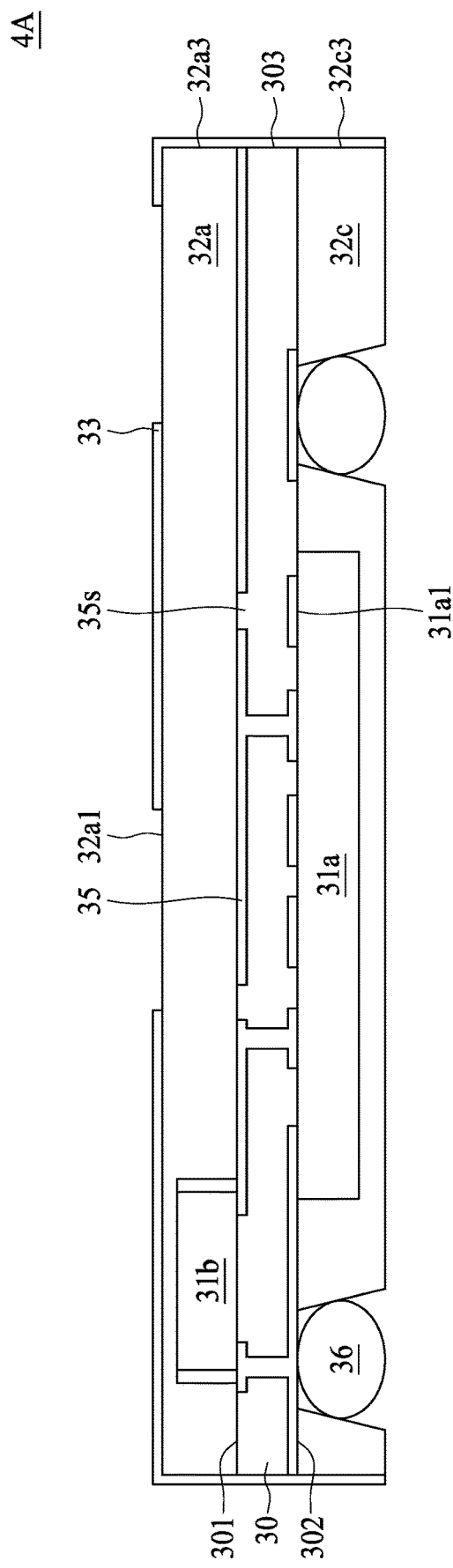
FIG. 4A illustrates a cross-sectional view of a semiconductor device package in accordance with some embodiments of the present disclosure.

FIG. 4A illustrates a cross-sectional view of a semiconductor device package 4A in accordance with some embodiments of the present disclosure. The semiconductor device package 4A is similar to the semiconductor device package 3A in FIG. 3A except that in FIG. 4A, the package body 32b and the conductive layer 34 in FIG. 3A are omitted. Therefore, the thickness of the semiconductor device package 4A can be reduced.

Figure 4B:
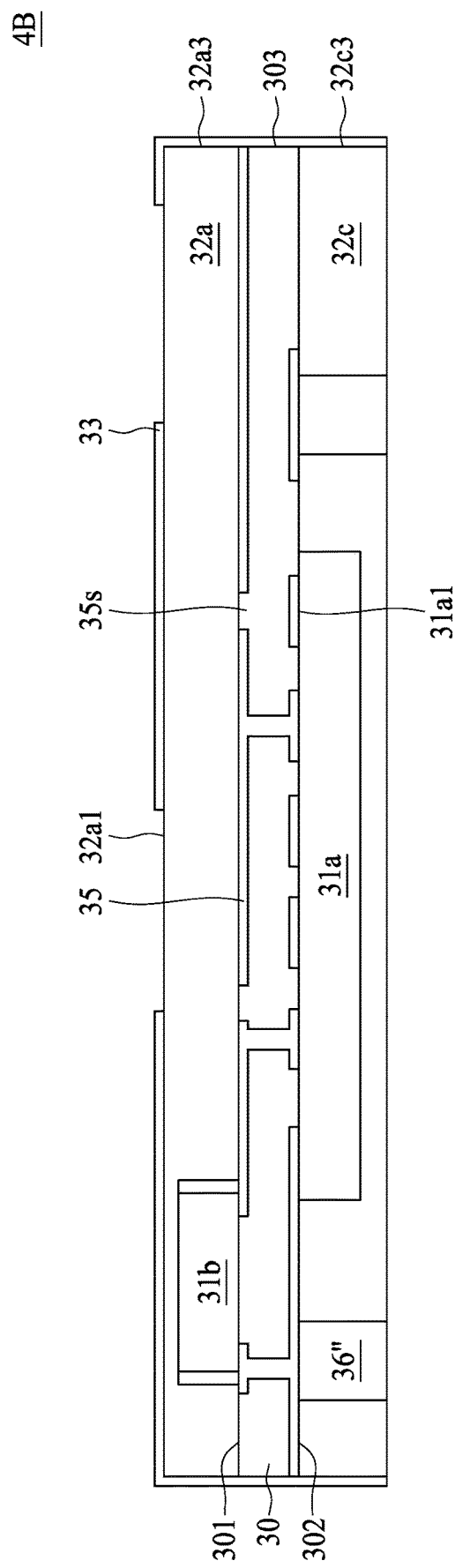
FIG. 4B illustrates a cross-sectional view of a semiconductor device package in accordance with some embodiments of the present disclosure.

FIG. 4B illustrates a cross-sectional view of a semiconductor device package 4B in accordance with some embodiments of the present disclosure. The semiconductor device package 4B is similar to the semiconductor device package 4A in FIG. 4A except that in FIG. 4B, the electrical contact 36 (which may be a solder bump) of the semiconductor device package 4A is replaced by a conductive post 36", such as a copper pillar.

FIG. 5A, FIG. 5B, FIG. 5C, FIG. 5D, FIG. 5E, FIG. 5F and FIG. 5G illustrate a semiconductor manufacturing method in accordance with some embodiments of the present disclosure. In some embodiments, the method in FIG. 5A, FIG. 5B, FIG. 5C, FIG. 5D, FIG. 5E, FIG. 5F and FIG. 5G can be used to manufacture the semiconductor device package 2 in FIG. 2.

Figure 5A:
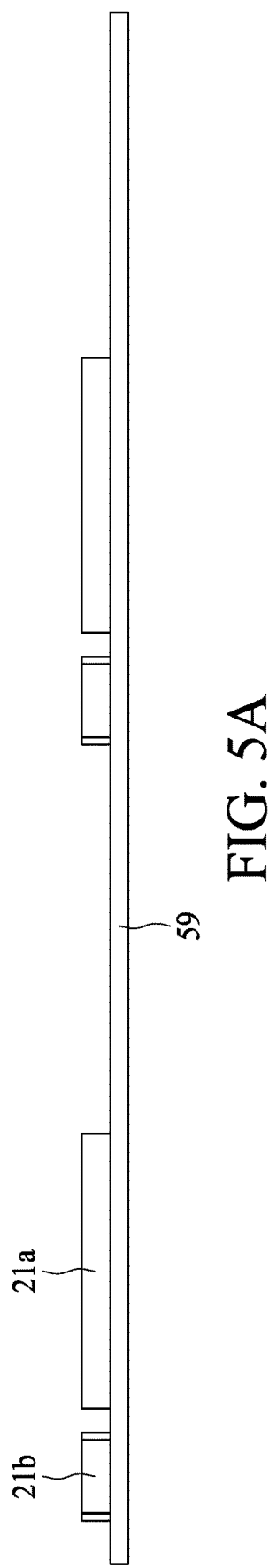

Referring to FIG. 5A, a carrier 59 is provided, and electronic components 21a, 21b are formed or disposed on the carrier 59. The electronic component 21a may be an active electronic component, such as an IC or a die. The electronic component 21b may be a passive electronic component, such as a capacitor, a resistor or an inductor.

Figure 5B:
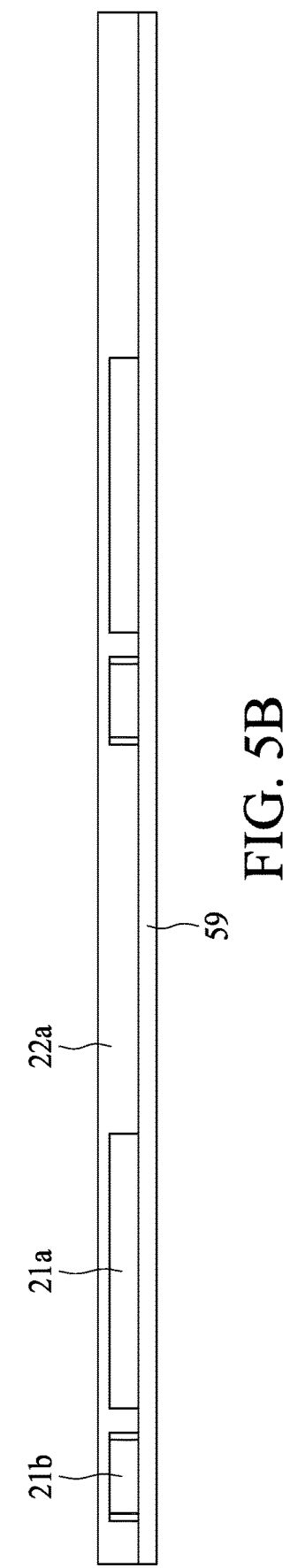

Referring to FIG. 5B, a package body 22a is formed or disposed on the carrier 59 and encapsulates the electronic components 21a, 21b. In some embodiments, the package body 22a includes an epoxy resin including fillers dispersed therein. The package body 22a may be formed or disposed by a molding technique, such as transfer molding or compression molding.

Referring to FIG. 5C, the carrier 59 is removed to expose active surfaces of the electronic components 21a, 21b. A circuit layer 20 (or substrate) including the antenna 23, an RDL and a dielectric layer is then formed on or attached to the active surfaces of the electronic components 21a, 21b. In some embodiments, an antenna 23 is also connected to the exposed active surface of the electronic component 21a, and the RDL is connected to the exposed active surfaces of the electronic components 21a, 21b.

Referring to FIG. 5D, solder bumps 26 are formed on the circuit layer 20 and are electrically connected to the RDL of the circuit layer 20 to provide electrical connections between the electronic components 21a, 21b and external circuits.

Figure 5E:
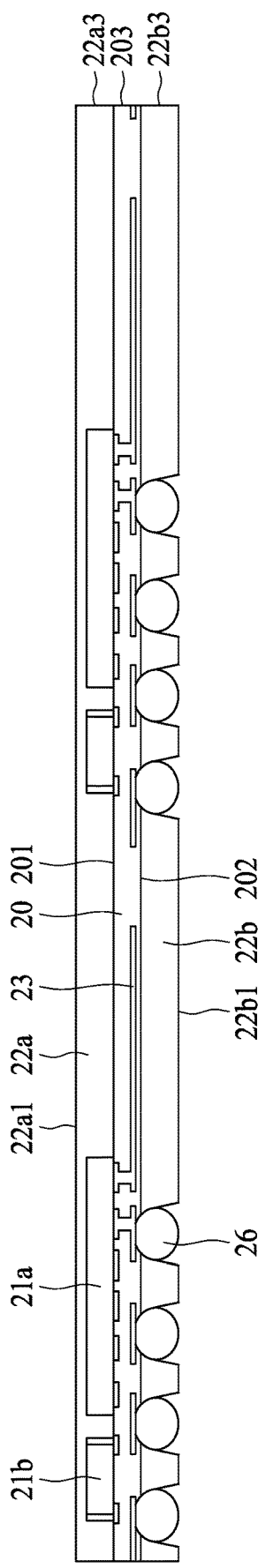

Referring to FIG. 5E, a package body 22b is formed or disposed on the circuit layer 20 and encapsulates a portion of the solder bumps 26. In some embodiments, the package body 22b includes an epoxy resin including fillers dispersed therein. The package body 22b may be formed or disposed by a molding technique, such as transfer molding or compression molding. In some embodiments, the process in FIG. 5E further includes forming a molding compound on the circuit layer 20 to cover the electronic components 21a, 21b; and removing a portion of the molding compound by, for example, laser, drilling or etching technique, to expose a portion of the solder bumps 26.

Figure 5F:
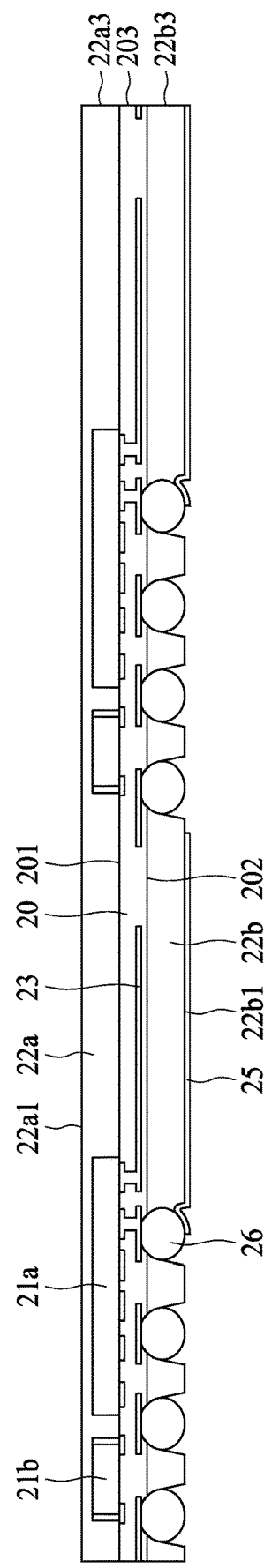

Referring to FIG. 5F, a reflector 25 is formed on the package body 22b by coating, sputtering or other suitable techniques. In some embodiments, the reflector 25 is connected to the exposed portion of at least one of the solder bumps 26.

Figure 5G:
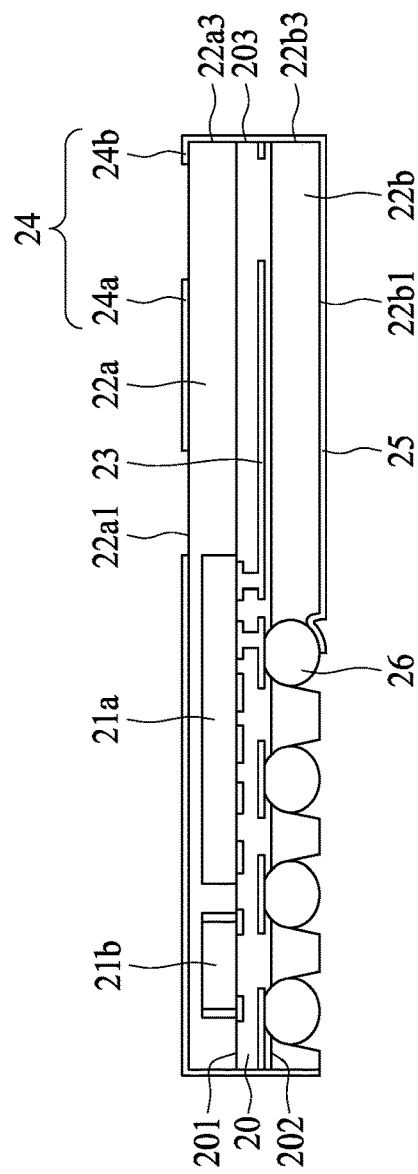

Referring to FIG. 5G, singulation may be performed to separate individual semiconductor device packages. For example, the singulation is performed through the package body 22a, the circuit layer 20 and the package body 22b. The singulation may be performed, for example, by using a dicing saw, laser or other suitable cutting technique. A conductive layer 24 including a first portion 24a and a second portion 24b is then formed on the package body 22a. The second portion 24b of the conductive layer 24 surrounds the first portion 24a of the conductive layer 24 and is separated from the first portion 24a of the conductive layer 24. The first portion 24a of the conductive layer 24 is formed on the package body 22a at a position corresponding to (e.g. above) the antenna 23. For example, the first portion 24a of the conductive layer 24 faces toward the antenna 23. In some embodiments, the second portion 24b of the conductive layer 24 extends along the lateral surface 22a3 of the package body 22a, the surface 203 of the substrate 20 and the lateral surface 22b3 of the package body 22b. In some embodiments, the second portion 24b of the conductive layer 24 is in contact with the reflector 25. In some embodiments, the second portion 24b of the conductive layer 24 can be electrically connected to a grounding element of the substrate 20.

FIG. 6A, FIG. 6B, FIG. 6C, FIG. 6D, FIG. 6E, FIG. 6F, FIG. 6G and FIG. 6H illustrate a semiconductor manufacturing method in accordance with some embodiments of the present disclosure. In some embodiments, the method in FIG. 6A, FIG. 6B, FIG. 6C, FIG. 6D, FIG. 6E, FIG. 6F and FIG. 6G can be used to manufacture the semiconductor device package 4B in FIG. 4B. In some embodiments, the method in FIG. 6A, FIG. 6B, FIG. 6C, FIG. 6D, FIG. 6E, FIG. 6F, FIG. 6G and FIG. 6H can be used to manufacture the semiconductor device package 3B in FIG. 3B.

Figure 6A:
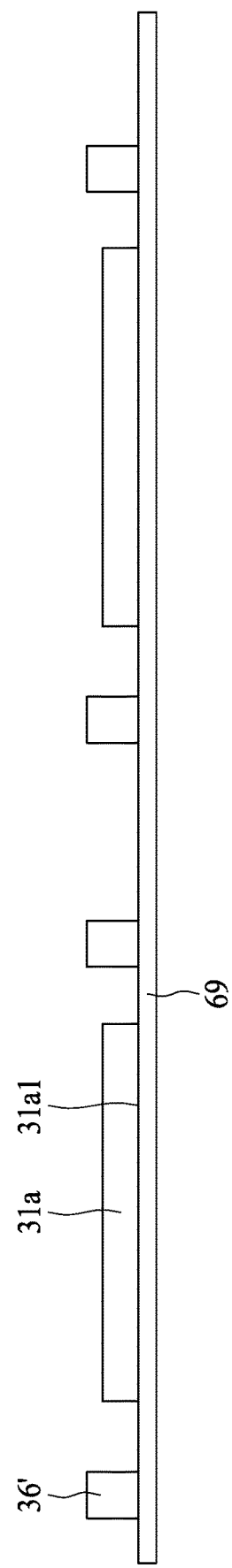
FIG. 6A, FIG. 6B, FIG. 6C, FIG. 6D, FIG. 6E, FIG. 6F, FIG. 6G and FIG. 6H illustrate a semiconductor manufacturing method in accordance with some embodiments of the present disclosure.

Referring to FIG. 6A, a carrier 69 is provided. An electronic component 31a and a conductive post 36' are then formed or disposed on the carrier 69. The electronic component 31a may be an active electronic component, such as an IC or a die.

Figure 6B:
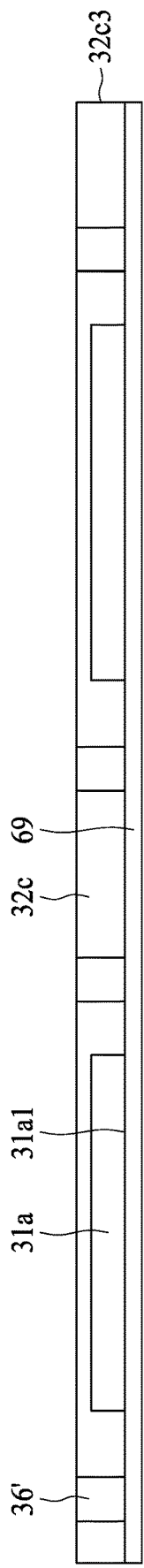

Referring to FIG. 6B, a package body 32c is formed or disposed on the carrier 69 and encapsulates the electronic component 31a and the copper pillars 36'. In some embodiments, a portion of the package body 32c is removed to expose a top portion of the conductive post 36'. In some embodiments, the package body 32c includes an epoxy resin including fillers dispersed therein. The package body 32c may be formed or disposed by a molding technique, such as transfer molding or compression molding.

Figure 6C:
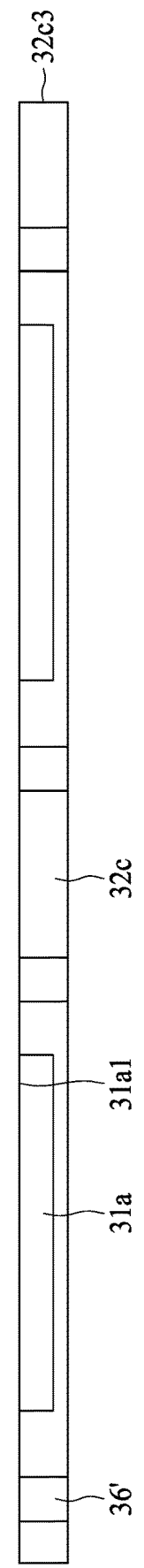
Figure 6D:
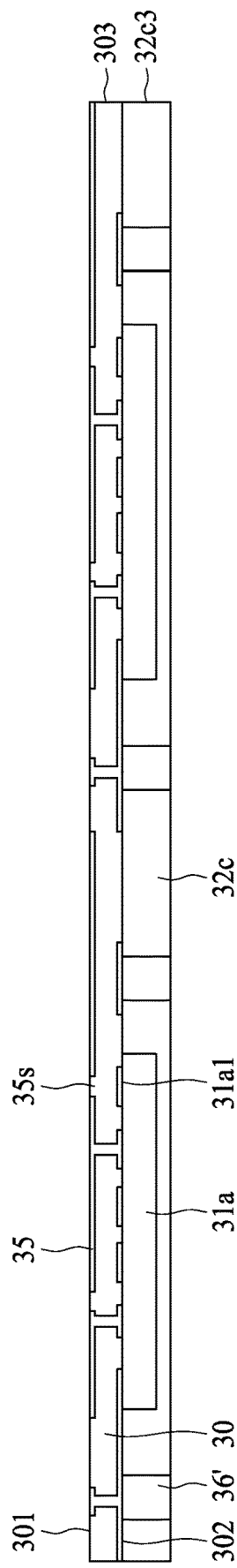

Referring to FIG. 6C, the carrier 69 is removed to expose an active surface of the electronic component 31a and the copper pillars 36'. Referring to FIG. 6D, a circuit layer 30 (or substrate) including a reflector 35, an RDL and a dielectric layer is then formed on or attached to the active surfaces of the electronic component 31a. In some embodiments, the reflector 35 is connected to the exposed active surface of the electronic component 31a, and the RDL is connected to the exposed active surface of the electronic component 31a and the conductive post 36'.

Figure 6E:
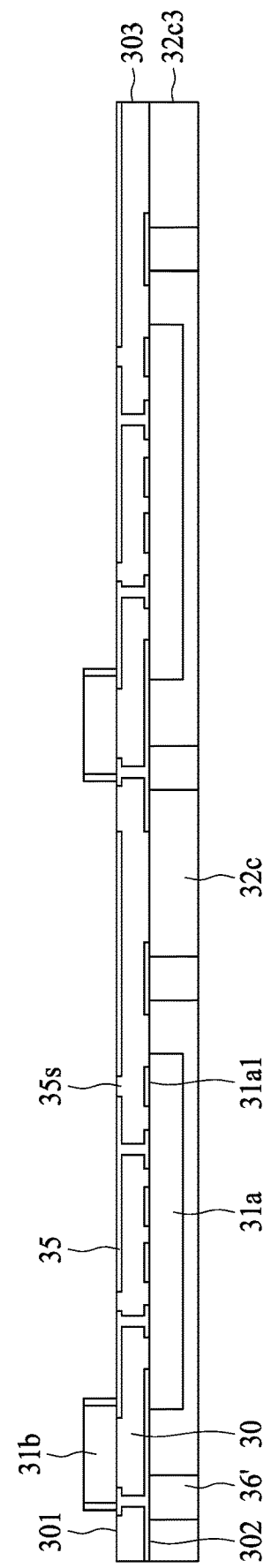

Referring to FIG. 6E, an electronic component 31b is formed on the circuit layer 30 and electrically connected to the RDL of the circuit layer 30. The electronic component 31b may be a passive electronic component, such as a capacitor, a resistor or an inductor.

Figure 6F:
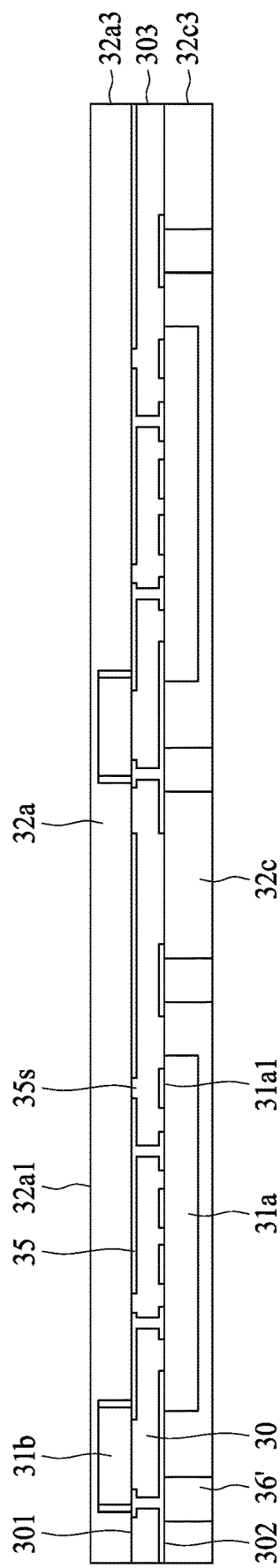
Figure 6G:
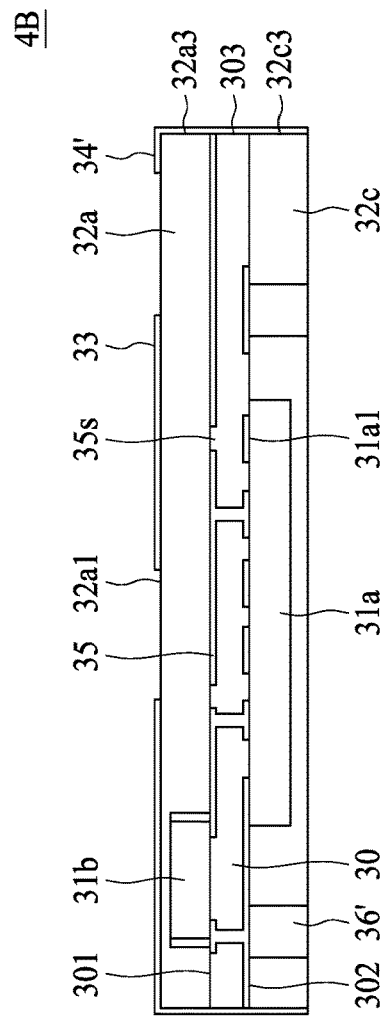

Referring to FIG. 6F, a package body 32a is formed or disposed on the circuit layer 30 and encapsulates the electronic component 31b. In some embodiments, the package body 32a includes an epoxy resin including fillers dispersed therein. The package body 32a may be formed or disposed by a molding technique, such as transfer molding or compression molding.

Referring to 6G, singulation may be performed to separate individual semiconductor device packages. For example, the singulation is performed through the package body 32a, the circuit layer 30 and the package body 32c. The singulation may be performed, for example, by using a dicing saw, laser or other suitable cutting technique. An antenna 33 is then formed on the package body 32a by coating, sputtering or other suitable techniques. In some embodiments, a conductive layer 34' is also formed on the package body 32a and separated from the antenna 33. In some embodiments, the conductive layer 34' is formed on the lateral surface 32a3 of the package body 32a, the surface 303 of the circuit layer 30 and the lateral surface 32c3 of the package body 32c to form the semiconductor 4B as shown in FIG. 4B.

Figure 6H:
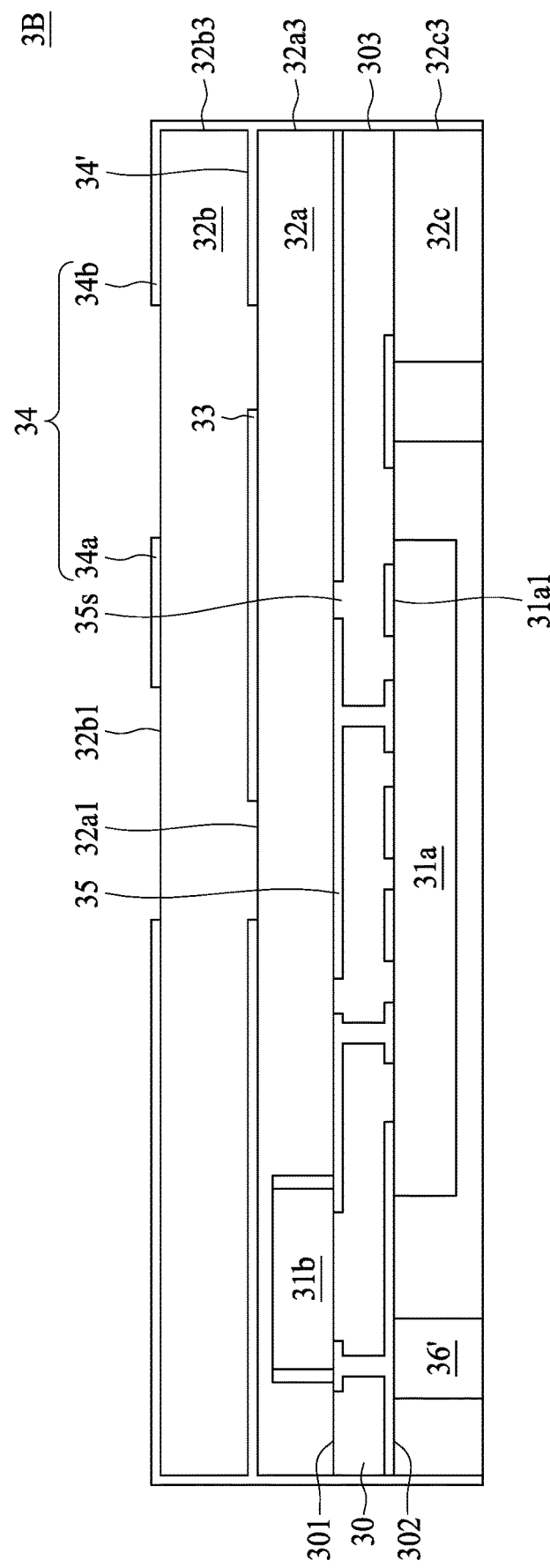

Referring to FIG. 6H, a package body 32b is formed or disposed on the package body 32a and encapsulates the antenna 33. In some embodiments, the package body 32b includes an epoxy resin including fillers dispersed therein. The package body 32b may be formed or disposed by a molding technique, such as transfer molding or compression molding. A conductive layer 34 including the first portion 34a and the second portion 34b is then formed on the package body 32b to form the semiconductor device package 3B in FIG. 3B. The second portion 34b of the conductive layer 34 surrounds the first portion 34a of the conductive layer 34 and is separated from the first portion 34a of the conductive layer 34. The first portion 34a of the conductive layer 34 is formed on the package body 32a at a position corresponding to (e.g. above) the antenna 33. For example, the first portion 34a of the conductive layer 34 faces toward the antenna 33. In some embodiments, the second portion 34b of the conductive layer 34 extends along the lateral surface 32b3 of the package body 32b to be connected to the conductive layer 34'. In some embodiments, the second portion 34b of the conductive layer 34 is grounded.

Figure 7C:
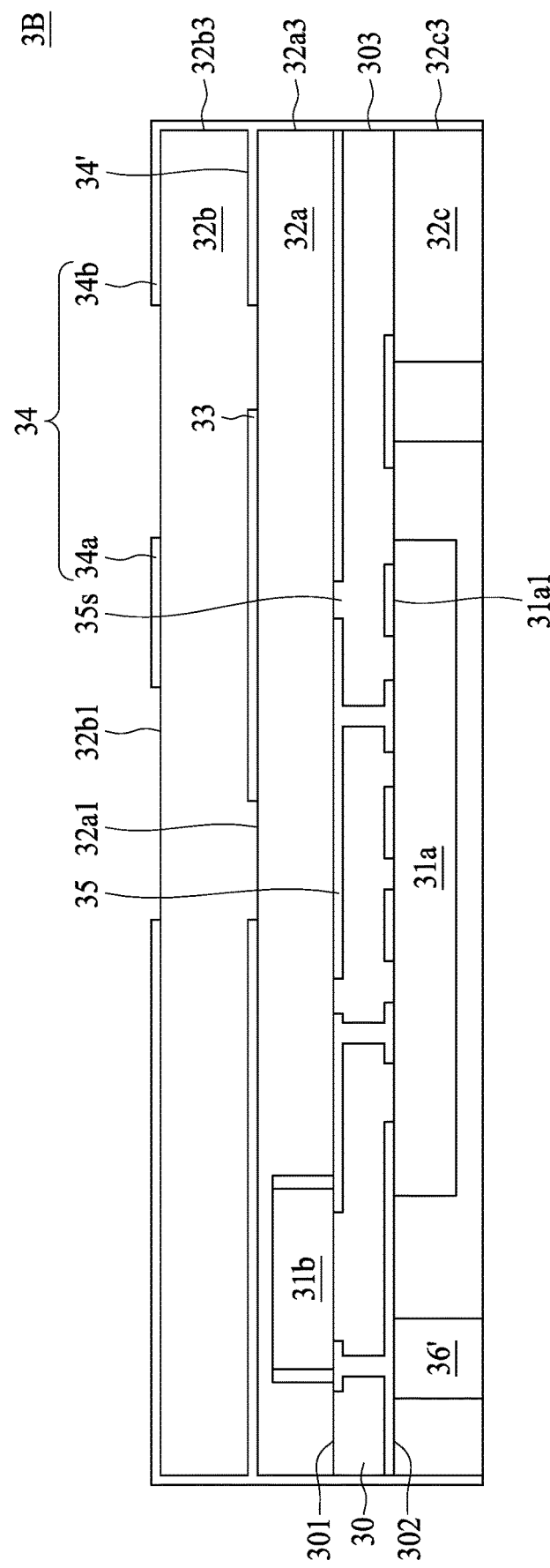

FIG. 7A, FIG. 7B and FIG. 7C illustrate a semiconductor manufacturing method in accordance with some embodiments of the present disclosure. In some embodiments, the process in FIG. 7A is performed subsequent to the process in FIG. 6F. In some embodiments, the method in FIG. 7A, FIG. 7B and FIG. 7C can be used to manufacture the semiconductor device package 3B in FIG. 3B.

Referring to FIG. 7A, the antenna 33 is formed on the package body 32a by coating, sputtering or other suitable techniques. In some embodiments, a conductive layer 34' is also formed on the package body 32a and separated from the antenna 33.

Referring to FIG. 7B, the package body 32b is formed or disposed on the package body 32a and encapsulates the antenna 33 and the conductive layer 34'. In some embodiments, the package body 32b includes an epoxy resin including fillers dispersed therein. The package body 32b may be formed or disposed by a molding technique, such as transfer molding or compression molding.

Referring to FIG. 7C, singulation may be performed to separate individual semiconductor device packages. For example, the singulation is performed through the package body 32b, the package body 32a, the circuit layer 30 and the package body 32c. The singulation may be performed, for example, by using a dicing saw, laser or other suitable cutting technique.

The conductive layer 34 including the first portion 34a and the second portion 34b is then formed on the package body 32b to form the semiconductor device package 3B in FIG. 3B. The second portion 34b of the conductive layer 34 surrounds the first portion 34a of the conductive layer 34 and is separated from the first portion 34a of the conductive layer 34. The first portion 34a of the conductive layer 34 is formed on the package body 32a at a position corresponding to (e.g. above) the antenna 33. For example, the first portion 34a of the conductive layer 34 faces toward the antenna 33. In some embodiments, the second portion 34b of the conductive layer 34 extends along the lateral surface 32b3 of the package body 32b to be connected to the conductive layer 34'. In some embodiments, the second portion 34b of the conductive layer 34 is grounded.

As used herein, the terms "substantially," "substantial," "approximately," and "about" are used to denote and account for small variations. For example, when used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. As another example, a thickness of a film or a layer being "substantially uniform" can refer to a standard deviation of less than or equal to ±10% of an average thickness of the film or the layer, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane. Two surfaces or components can be deemed to be "substantially perpendicular" if an angle therebetween is, for example, 90°±10°, such as ±5°, ±4°, ±3°, ±2°, ±1°, ±0.5°, ±0.1°, or ±0.05°. When used in conjunction with an event or circumstance, the terms "substantially," "substantial," "approximately," and "about" can refer to instances in which the event or circumstance occurs precisely, as well as instances in which the event or circumstance occurs to a close approximation.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It can be understood that such range formats are used for convenience and brevity, and should be understood flexibly to include not only numerical values explicitly specified as limits of a range, but also all individual numerical values or sub-ranges encompassed within that range as if each numerical value and sub-range is explicitly specified.

While the present disclosure has been described and illustrated with reference to specific embodiments thereof, these descriptions and illustrations do not limit the present disclosure. It can be clearly understood by those skilled in the art that various changes may be made, and equivalent elements may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and such. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor device package, comprising:
   a circuit layer having a first surface, a second surface opposite to the first surface and a third surface extended between the first surface and the second surface;
   an antenna structure disposed within the circuit layer;
   a first encapsulant disposed on the first surface of the circuit layer, the first encapsulant having a first surface in contact with the first surface of the circuit layer, a second surface opposite to the first surface, and a lateral surface extended between the first surface and the second surface;
   a reflector disposed on and in contact with the second surface of the first encapsulant;
   an electrical contact disposed within the first encapsulant, a portion of the electrical contact exposed from the first encapsulant;
   a second encapsulant disposed on the second surface of the circuit layer, the second encapsulant having a first surface, a second surface opposite to the first surface of the second encapsulant and a third surface extended between the first surface of the second encapsulant and the second surface of the second encapsulant; and
   a conductive layer disposed on the first surface of the second encapsulant,
   wherein the third surface of the circuit layer is substantially coplanar with the lateral surface of the first encapsulant.

2. The semiconductor device package of claim 1, wherein the conductive layer includes a first portion at a position corresponding to the antenna structure and a second portion separated from the first portion, and
   the second portion of the conductive layer extends from the first surface of the second encapsulant to the third surface of the second encapsulant, the third surface of the circuit layer and the lateral surface of the first encapsulant.

3. The semiconductor device package of claim 2, wherein the second portion of the conductive layer is in contact with the reflector.

4. The semiconductor device package of claim 1, wherein the electrical contact is disposed adjacent to the first surface of the circuit layer, wherein a portion of the electrical contact is in contact with the reflector.

5. The semiconductor device package of claim 1, wherein the reflector is grounded and disposed at a position corresponding to the antenna structure.

6. A semiconductor device package, comprising:
   a circuit layer having a first surface, a second surface opposite to the first surface and a third surface extended between the first surface and the second surface;
   a reflector disposed within the circuit layer;
   a first encapsulant disposed on the first surface of the circuit layer and in contact with the reflector;
   an antenna structure disposed on and in contact with the first encapsulant, wherein the reflector defines a slot at a position corresponding to the antenna structure; and
   an electronic component disposed on the second surface of the circuit layer, wherein the circuit layer includes a feeding line disposed adjacent to the second surface of the circuit layer and electrically connected to the electronic component, and wherein the feeding line is disposed at a position corresponding to the slot of the reflector.

7. The semiconductor device package of claim 6, further comprising a conductive layer disposed on the first encapsulant and separated from the antenna structure.

8. The semiconductor device package of claim 7, wherein the first encapsulant has a first surface and a second surface, and the conductive layer is extended from the first surface of the first encapsulant to the second surface of the first encapsulant and the third surface of the circuit layer.

9. The semiconductor device package of claim 8, wherein a portion of the reflector is exposed from the third surface of the circuit layer and is in contact with the conductive layer.

10. The semiconductor device package of claim 8, further comprising a second encapsulant disposed on the second surface of the circuit layer and encapsulating the electronic component, wherein the conductive layer is extended to a surface of the second encapsulant.

11. The semiconductor device package of claim 6, further comprising:
    a second encapsulant disposed on the first encapsulant and encapsulating the antenna structure; and
    a conductive layer disposed on the second encapsulant.

12. The semiconductor device package of claim 11, wherein
    the conductive layer includes a first portion at a position corresponding to the antenna structure and a second portion separated from the first portion,
    the second encapsulant has a first surface and a second surface, and
    the second portion of the conductive layer is extended from the first surface of the second encapsulant to the second surface of the second encapsulant, a surface of the first encapsulant and the third surface of the circuit layer.

13. A semiconductor device package, comprising:
    a reflector;
    a first encapsulant disposed on the reflector; and
    an antenna structure disposed on the first encapsulant,
    wherein a tolerance of a distance between the antenna structure and the reflector is about 2 μm to about 8 μm.

14. The semiconductor device package of claim 13, further comprising a circuit layer having a first surface, a second surface opposite to the first surface and a third surface extended between the first surface of the circuit layer and the second surface of the circuit layer, wherein the antenna structure is disposed within the circuit layer, and the first encapsulant covers the first surface of the circuit layer and separates the antenna structure from the reflector.

15. The semiconductor device package of claim 14, further comprising:
    a second encapsulant covering the second surface of the circuit layer; and
    a conductive layer disposed on the second encapsulant.

16. The semiconductor device package of claim 15, wherein
    the conductive layer includes a first portion at a position corresponding to the antenna structure and a second portion separated from the first portion,
    the second encapsulant has a first surface and a second surface, and
    the second portion of the conductive layer is extended from the first surface of the second encapsulant to the second surface of the second encapsulant, the third surface of the circuit layer and a surface of the first encapsulant.

17. The semiconductor device package of claim 13, further comprising a circuit layer having a first surface and a second surface opposite to the first surface, wherein the reflector is disposed within the circuit layer, and the first encapsulant covers the first surface of the circuit layer and separates the antenna structure from the reflector.

18. The semiconductor device package of claim 17, wherein the reflector defines a slot at a position corresponding to the antenna structure.

19. The semiconductor device package of claim 18, further comprising an electronic component disposed on the second surface of the circuit layer, wherein the circuit layer includes a feeding line adjacent to the second surface of the circuit layer and electrically connected to the electronic component, and the feeding line is disposed at a position corresponding to the slot of the reflector.

\* \* \* \* \*